United States Patent [19]

Henry et al.

[11] Patent Number: 6,011,401
[45] Date of Patent: Jan. 4, 2000

[54] REFERENCE-FREE DIRECT DIGITAL LOCK-IN METHOD AND APPARATUS

[75] Inventors: James E. Henry; John A. Leonard, both of Goleta, Calif.

[73] Assignee: Raytheon Company, Lexington, Mass.

[21] Appl. No.: 08/858,996

[22] Filed: May 20, 1997

[51] Int. Cl.[7] ................................................. G01R 31/302
[52] U.S. Cl. .......................................................... 324/752
[58] Field of Search .............................. 324/752, 158.1, 324/765, 621, 750; 327/308; 250/334, 574; 702/71; 714/700

[56] References Cited

U.S. PATENT DOCUMENTS

| | | | |
|---|---|---|---|
| 4,950,897 | 8/1990 | Mandelis et al. | 250/334 |
| 5,063,301 | 11/1991 | Turkevich et al. | 250/574 |
| 5,499,190 | 3/1996 | Takahashi et al. | 324/621 |

*Primary Examiner*—Vinh P. Nguyen
*Attorney, Agent, or Firm*—William C. Schubert; Glenn H. Lenzen, Jr.

[57] ABSTRACT

A reference-free direct digital lock-in system (RDDL 10) has a first input coupled to a periodic electrical signal and an output for outputting an indication of a magnitude of a desired periodic signal component. The RDDL also has a second input for receiving a signal (9) that specifies a reference period value, and operates to autonomously generate a lock-in reference signal having a specified period and a phase that is adjusted to maximize a magnitude of the outputted desired periodic signal component. In an embodiment of a measurement system that includes the RDDL 10 an optical source provides a chopped light beam having wavelengths within a predetermined range of wavelengths, and the periodic electrical signal is generated by at least one photodetector that is illuminated by the chopped light beam. In this embodiment the measurement system characterizes, for at least one wavelength of light that is generated by the optical source, a spectral response of the at least one photodetector. The RDDL can operate in nonreal-time upon previously generated and stored digital equivalent values of the periodic electrical signal or signals.

7 Claims, 4 Drawing Sheets

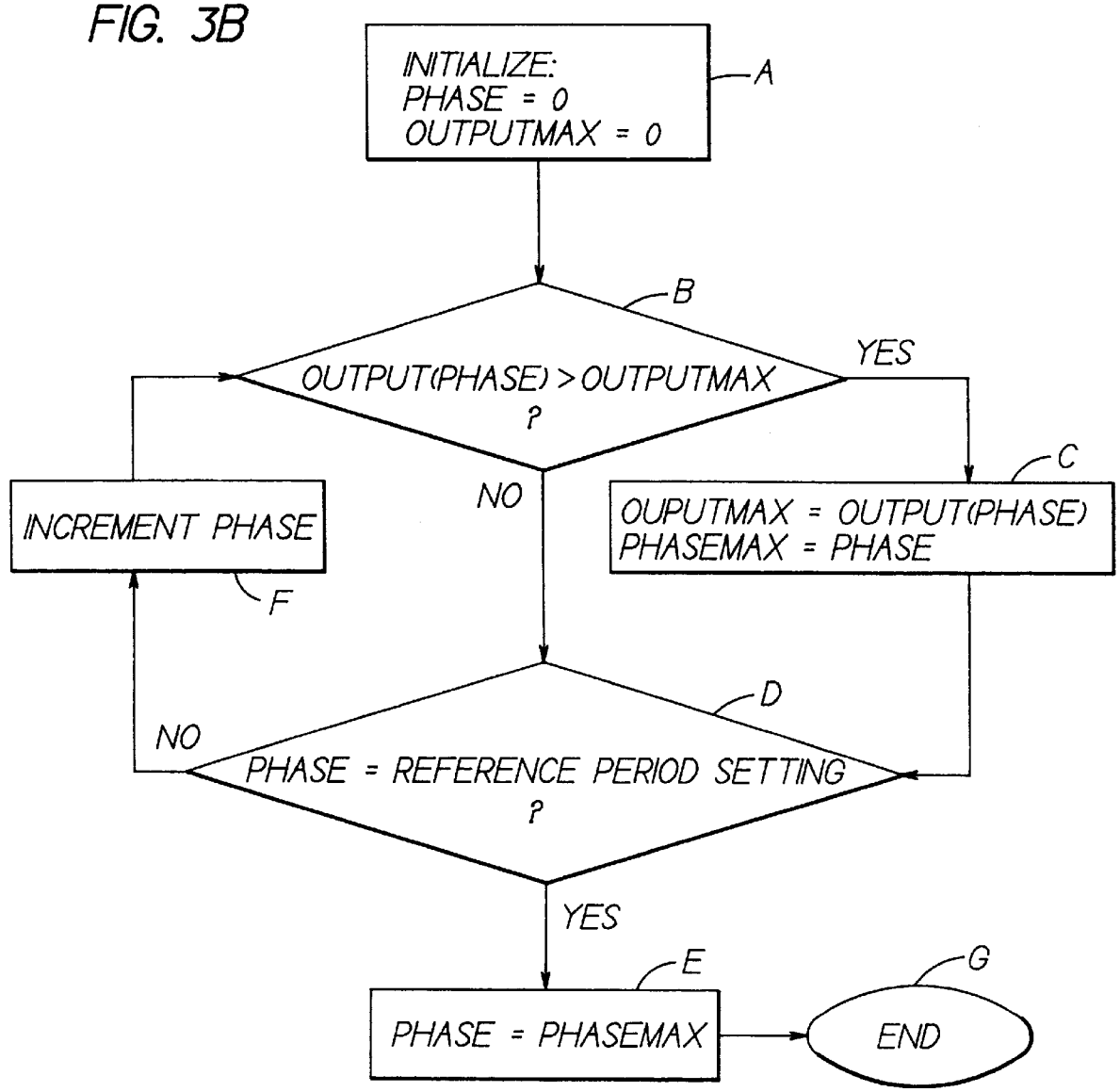

REFERENCE-FREE DIRECT DIGITAL LOCK-IN METHOD AND APPARATUS

The invention described herein was made in the performance of work under NASA Contract No. NASA5-30800 and is subject to the provisions of Section 305 of the National Aeronautics and Space Act of 1958 (72 Stat. 435; 42 USC 2457).

FIELD OF THE INVENTION

This invention relates generally to signal measurement systems known generally as lock-in amplifiers and, in particular, relates to digitally implemented lock-in amplifiers.

BACKGROUND OF THE INVENTION

Lock-in amplifiers are widely used to extract weak signals from large amounts of noise. The use of a lock-in amplifier enables accurate measurements may be made even when a small signal is obscured by a thousand-fold larger noise source. Lock-in amplifiers employ a synchronous detection technique to extract a desired signal component at a specific reference frequency and phase. As a result, any noise signal components at frequencies other than the reference frequency are rejected. The output of a lock-in amplifier is typically a DC signal proportional in magnitude to a low pass filtered product of the input signal and an output of a periodic function generator.

FIG. 1 illustrates a conventional signal measurement system 1 that includes a lock-in amplifier 2. A source 3 provides a stimulus signal to a unit under test (UUT) 4 and a corresponding reference signal to a first input of the lock-in amplifier 2. In response to the stimulus signal the UUT 4 outputs an analog signal to a second input of the lock-in amplifier 2. Using the reference signal, the lock-in amplifier 2 extracts a desired signal component from the analog signal and outputs same as a measured output signal. Any noise signal components of the analog output signal, which are not correlated with the reference signal, are rejected and, ideally, do not appear within the measured output signal. It can be appreciated that the lock-in amplifier operates in a manner similar to a synchronous detector or to a bandpass filter that is tuned to the frequency of the desired signal component.

Although suitable for use in many applications, the conventional lock-in amplifier of FIG. 1 can precluded from use in those applications where, by example, a suitable reference signal input is not available, or where the output of the UUT 4 is available only in a nonreal-time digital format.

OBJECTS OF THIS INVENTION

It is a first object of this invention to provide a lock-in amplifier wherein a reference signal input is not required.

It is another object of this invention to provide a lock-in amplifier that can input and process digital data to perform a synchronous detection measurement.

SUMMARY OF THE INVENTION

The foregoing and other problems are overcome and the objects of the invention are realized by a measurement system for characterizing a unit under test. The measurement system includes a unit for stimulating a unit under test to output a periodic electrical signal; and a lock-in amplifier having an input coupled to the periodic electrical signal and an output for outputting a signal that is a function of a desired signal component of the input signal. If not already in a digital format, a conversion unit is interposed between the lock-in amplifier and the unit under test for converting the periodic electrical signal to a digital equivalent signal. The lock-in amplifier further includes a second input for specifying a reference period expressed in units of data samples, and operates to autonomously generate a lock-in reference signal having a period and phase that maximizes a magnitude of the desired electrical signal at the output.

In an embodiment of a signal measurement system that is constructed in accordance with this invention, the stimulating unit includes an optical source that provides a chopped light beam having wavelengths within a predetermined range of wavelengths, and the periodic electrical signal is generated by at least one photodetector that is illuminated by the chopped light beam. In this embodiment the measurement system characterizes a spectral response of the at least one photodetector at at least one wavelength of light that is generated by the optical source, Further in accordance with this invention a digital lock-in amplifier includes an input node for receiving a digital input signal representing a desired periodic signal component and at least one undesired signal component. The input node includes a multiplier having a first input coupled to the digital input signal, a second input, and an output. A filter, preferably a digital low pass filter, has an input coupled to the output of the multiplier and an output coupled to an output node of the digital lock-in amplifier. The lock-in amplifier further includes a reference signal generator having a first input coupled to the output of the filter and an output coupled to the second input of the multiplier. The reference signal generator has a second input coupled to a signal that specifies a period that corresponds to a period of the desired periodic signal component, and operates to generate a digital representation of a reference signal having the specified period and a phase. The generated reference signal is adjusted so as to maximize a magnitude of the desired periodic signal component that is output from the filter. The period is expressed in units of data samples.

The reference signal generator includes a phase setting unit having a first input coupled to the output of the filter, a second input coupled to the reference period setting signal, and an output providing a phase signal. The phase setting unit operates to generate the phase signal in response to the desired periodic signal component so as to maximize a magnitude of the desired periodic signal component that is output from the filter, and generates phase angles from zero degrees up to a value specified by the reference period signal. The reference signal generator further includes a periodic signal function generator having an output coupled to the second input of the multiplier for providing the digital representation of the reference signal having a specified period and a phase component to the second input of the multiplier. The periodic signal function generator further includes a first input coupled to the phase signal output from the phase setting unit and a second input coupled to the signal that specifies the period expressed in units of data samples. The periodic signal function generator is responsive to the phase signal and to the frequency specifying signal for generating the digital representation of the reference signal to have the specified period and phase.

BRIEF DESCRIPTION OF THE DRAWINGS

The above set forth and other features of the invention are made more apparent in the ensuing Detailed Description of the Invention when read in conjunction with the attached Drawings, wherein:

FIG. 3B is a logic flow diagram that illustrates the operation of the Signal Optimizer block of FIG. 3B;

DETAILED DESCRIPTION OF THE INVENTION

Figure 1:
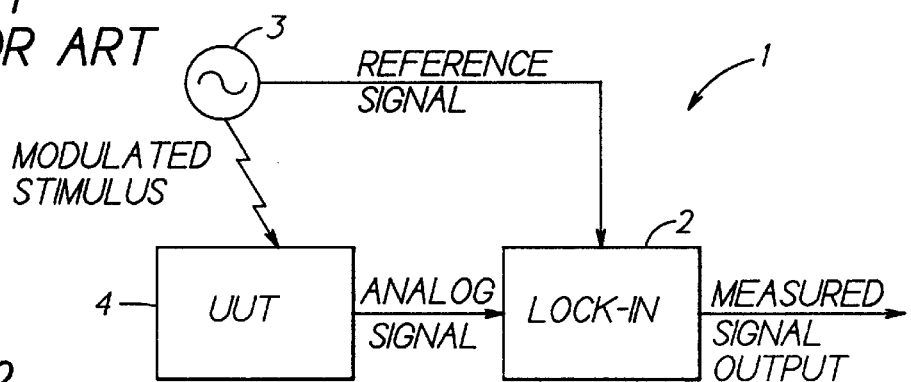
FIG. 1 is a block diagram of a conventional lock-in amplifier that requires an input reference signal.
Figure 2:
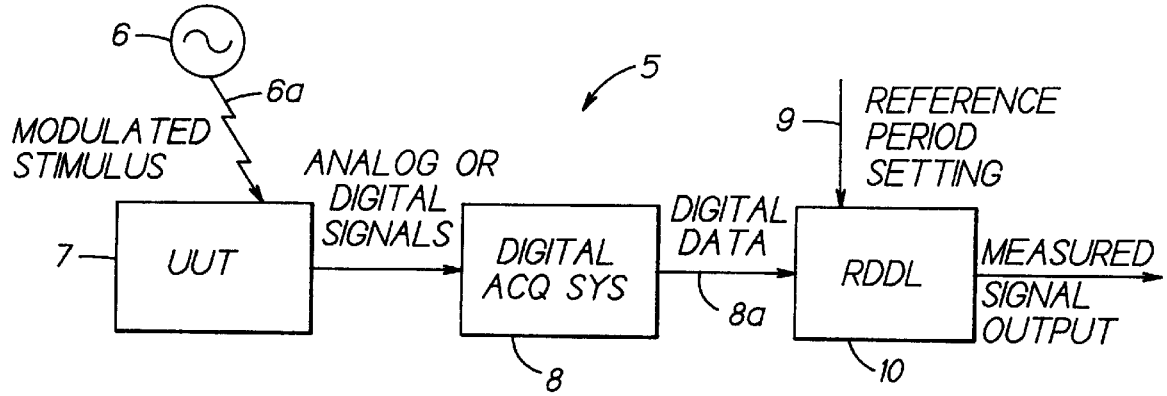
FIG. 2 is a block diagram illustrating an exemplary application for the reference-free direct digital lock-in (RDDL) amplifier of this invention.

By way of introduction, reference is made to FIG. 2 for illustrating a signal measurement system 5 that is constructed and operated in accordance with this invention. In the system 5, a source 6 provides a periodically modulated stimulus signal 6a to a UUT 7. The UUT 7 may output either analog or digital signals in response to the modulated stimulus input. A digital acquisition system 8 is employed for converting analog signals to digital data at a desired sampling rate. If the input is in digital form the digital acquisition system 8 may be eliminated, or may be employed for reformatting or otherwise processing (e.g., serial to parallel conversion) the input digital data. The output of the digital acquisition system 8 is digital data 8a that is applied, in conjunction with a reference period setting signal 9, to the reference-free direct digital lock-in system (RDDL) 10 of this invention. The output of the RDDL 10 is a measured signal output that corresponds to a desired signal component, having period and phase components, that is output from the UUT 7.

The reference period setting signal 9 is determined from the period of the external modulation signal 6a, and from the sample frequency at the output of the UUT 7, as:

Reference Period Setting=Sampling Frequency×Modulation Period.

By example, and assuming that the sampling frequency is equal to 100 samples/second and that the modulation period is equal to 0.1 seconds (i.e., 10 Hz), the reference period setting is equal to 10 samples.

The reference period setting signal 9 can be derived from any of a number of suitable sources such as, by example, thumbwheel switches or from the output of a digital data processor.

Figure 3A:
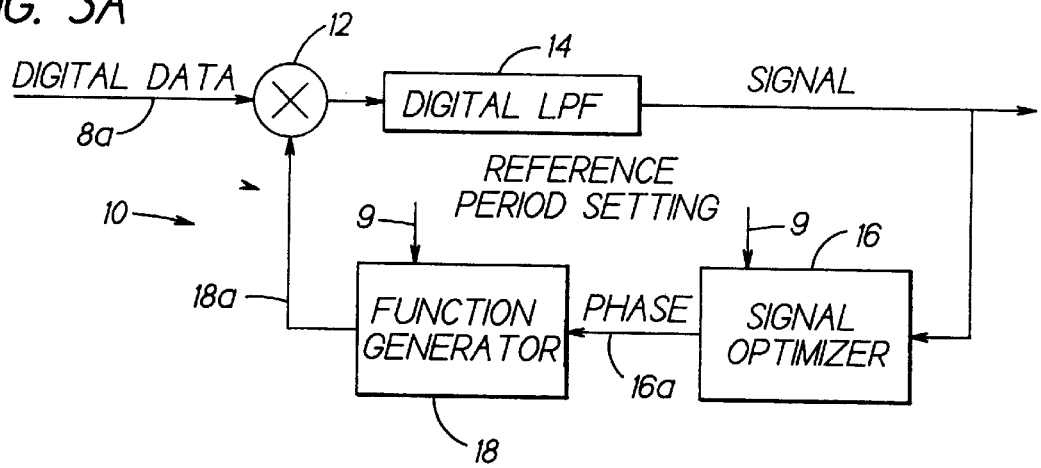
FIG. 3A is a block diagram of the RDDL amplifier of FIG. 2.

FIG. 3A illustrates the RDDL 10 in greater detail. The input digital data 8a is applied to an input node 12 which functions as a digital multiplier. The output of the node 12 is input to a filter, preferably a digital low pass filter (LPF) 14, which may be initialized to a steady state operating point, if desired, to reduce settling time. The output of the LPF 14 is the measured output signal. The RDDL 10 functions as a closed loop system. As such, a portion of the output signal from the LPF 14 is input to a signal optimizer 16 which provides a PHASE output 16a to an input of a function generator 18. The reference period setting 9 is provided to an input to the signal optimizer 16. The purpose of the reference period setting signal 9 is made apparent below in the discussion of Block D of FIG. 3B. The signal optimizer 16 operates to determine the maximum output value from the RDDL 10 over all possible values of phase. Phase values are preferably tested over a range beginning with zero and ending at the value specified by the reference period setting 9. The phase search is completed when the comparison indicated by Block D of FIG. 3B is true.

A second input to the function generator 18 is the reference period setting signal 9. In accordance with the reference period setting signal 9, and the PHASE input 16a, the function generator 18 outputs a synthesized digital reference signal 18a (e.g., sinusoidal, pulse, square, modified square, etc. depending on application) to the node 12, which is then used to multiply the input digital data 8a by the reference signal 18a. The function generator 18 produces a sequence of values starting at the phase angle input from the signal optimizer 16, and continuously wraps around until the input data sequence has been matched in length. The effect is to filter out or reject all input signal components of the input digital data 8a that do not correspond to the signal component that is desired to be measured. The function generator 18 outputs a digital data signal with an equivalent number of samples per period as the digital data input. The phase of the function generator 18 is incrementally adjusted over an entire modulation period, between zero and the number of samples per period.

Each pair of values from the input digital data 8a and the function generator 18 is multiplied, and the product is passed to the digital LPF 14. This continues until the entire input digital data sequence has been processed.

When the phase search is completed, the output signal from the digital LPF 14 is a valid relative measurement. That is, the measured value depends on the function selected. A subsequent analysis or calibration can be performed if an absolute measurement is desired.

With long input data sequences a variation of modulation frequency, or phase drift, may result in an error. The RDDL 10 can lock-in or track the phase to reduce this error. Lock-in may be accomplished by dividing the original data sequence into a series of smaller contiguous sequences, or overlapping sequences, and averaging the results. The phase can also be measured by this process.

It should be realized that the RDDL 10 can also be employed with nonreal-time inputs data, such as buffered data packets. This mode of operation is not realizable with conventional lock-in amplifiers, in that a real-time reference signal is not directly related to the buffered nonreal-time data.

Relatedly, any delay for the low pass filter 14 transient response can be eliminated when using nonreal-time data packets as the input. In accordance with an aspect of this invention, an initialization procedure for the digital LPF 14 that is based on data sequence statistics has been found to provide a very rapid settling to a steady state condition. The rapid settling time of the digital LPF 14 enables the measurement of shorter data sequences than is possible with conventional lock-in amplifier approaches.

Furthermore, it should be realized that the use of the RDDL 10, in accordance with the teaching of this invention, enables multiple channels of data, acquired in parallel and suitably buffered, to be processed sequentially with a single RDDL 10, thereby reducing complexity, volume, power consumption, and cost.

In this regard the digital acquisition system 8 that is illustrated in FIG. 2 can receive multiple inputs, and may include a suitable buffer or buffers for storing digital values prior to the application of the digital values (8*a*) to the RDDL 10.

Reference is now made to FIG. 3B for showing a logic flow diagram that illustrates the operation of the signal optimizer 16 of FIG. 3A. At block A the signal optimizer 16 is initialized to set a PHASE variable (i.e., the output 16*a* to the function generator 18) to zero and an OUTPUTMAX variable to zero. At block B a determination is made if the magnitude of the RDDL output OUTPUT(PHASE) from the LPF 14 is greater than OUTPUTMAX. If yes, control passes to block C where OUTPUTMAX is made equal to the magnitude of OUTPUT(PHASE), and a variable PHASEMAX is made equal to PHASE. PHASEMAX identifies the phase value determined in the phase search where the RDDL 10 output yields the value OUTPUTMAX. Control then passes to block D where a comparison is made to determine if PHASE is equal to the reference period setting 9. Block D is also entered from Block B if OUTPUT(PHASE) is not greater than OUTPUTMAX. At Block D, if PHASE is found to be equal to the reference period setting 9, the signal optimizer 16 sets PHASE=PHASEMAX, and terminates operation at Block G. This indicates that the phase search is complete. If, at Block D, the result of the comparison indicates that PHASE is not equal to the reference period setting 9, control passes to Block F where the output signal PHASE to the function generator 18 is incremented. Control then passes again to Block B to determine if OUTPUT (PHASE) has correspondingly increased such that it exceeds the value of OUTPUTMAX, and blocks C or D are executed accordingly. A suitable increment value for PHASE is one data sample.

In general, the signal optimizer 16 searches in order to find the maximum measured signal output by adjusting the phase input 16*a* to the function generator 18. The phase is adjusted over an entire modulation period, between zero and the value of the reference period setting 9. The final output signal from the RDDL 10 is then the relative measurement output, OUTPUTMAX, at PHASE=PHASEMAX.

Figure 8:
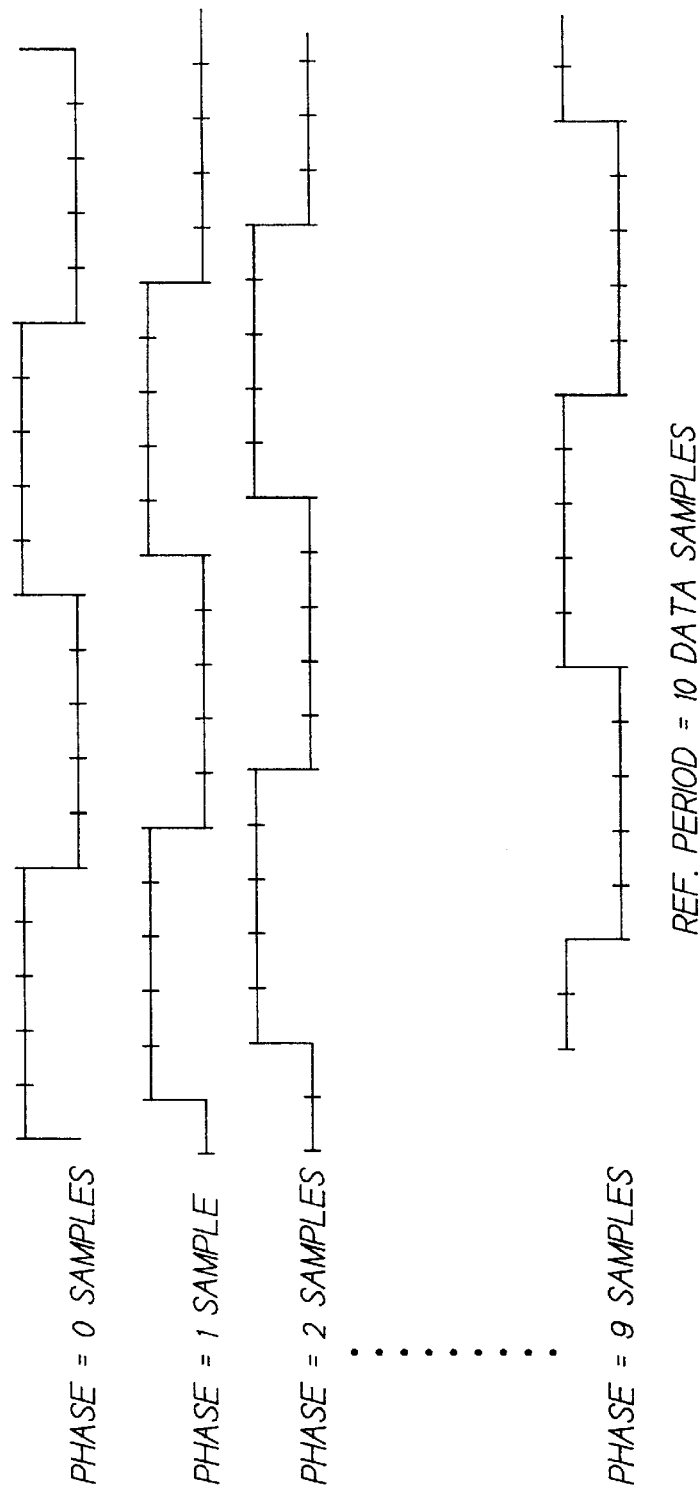
FIG. 8 is a waveform diagram that illustrates a relationship between a phase angle value output by the Signal Optimizer block and a reference period setting signal, assuming a reference period equal to 10 data samples.

The relationship between phase angle value output by the signal optimizer 16 and the reference period setting signal 9 is illustrated in the waveform diagram of FIG. 8.

Having described the RDDL 10 of this invention, one suitable application of same is now described. In particular, the application is a system for measuring a relative spectral response (RSR) of a photodetector or an array of photodetectors, such as infrared radiation (IR) photodetectors. It should be realized that the described application embodiment is exemplary, and is in no way to be construed in a limiting sense upon the practice of this invention.

Figure 4:
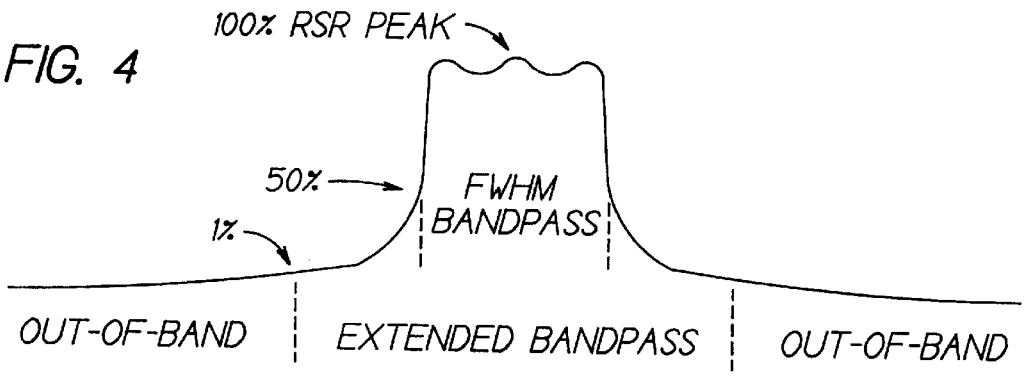
FIG. 4 illustrates a waveform useful for understanding various terms used in conjunction with an exemplary relative spectral response (RSR) measurement system that employs the RDDL amplifier of this invention.

FIG. 4 illustrates a photodetector spectral response waveform and is useful for describing several RSR-related terms and definitions. The bandpass wavelength interval is defined as the Full Width at Half Maximum (FWHM). The extended bandpass is the full width at 1% of maximum. Other points not shown are 5% and 80% of peak response which are used to quantify an Edge Range, a wavelength interval in nanometers. Also characterized is ripple within 80% of the peak points of the bandpass region.

Measurement goals are to characterize several in-band parameters of the RSR, to determine an integrated out-of-band energy in the lower 1% tails of the RSR, and to confirm that the integrated out-of-band energy does not exceed 5% of the integrated extended-band RSR. This is a difficult measurement to obtain since the lowest signal-to-noise ratio can be expected to occur in this region.

Figure 5:
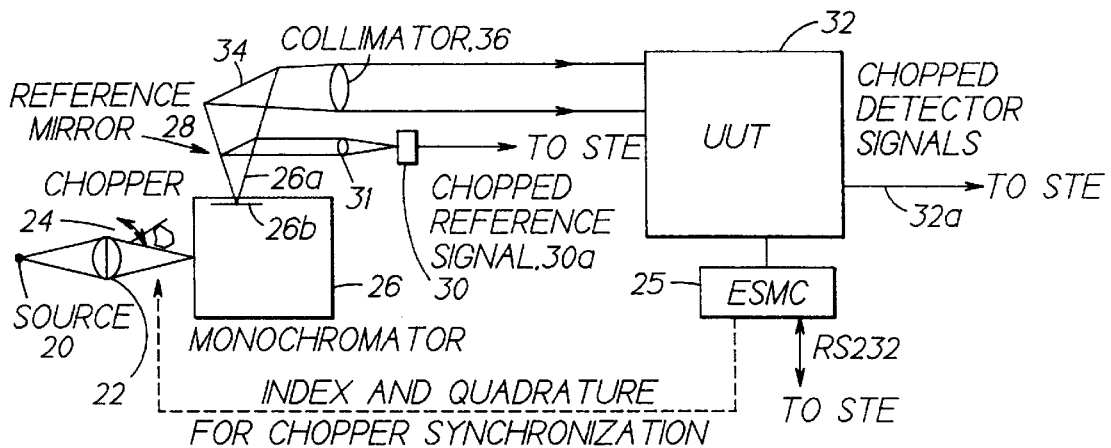
FIG. 5 is a block diagram illustrating the RSR measurement system that benefits from the use of the RDDL amplifier.

FIG. 5 is a simplified block diagram of an RSR measurement system that provides stimulus and data acquisition. Starting with a stabilized optical source 20 and a focussing lens 22, the source light is applied to a chopper 24. The chopper speed is controlled through a phase locked motor by index pulse and quadrature signals output from an External Scan Mirror Controller (ESMC) 25 so as to be synchronized with the motion of a scan mirror (not shown) that is contained within a UUT 32. The chopped light is then applied to a monochromator 26 which provides a wavelength selected chopped beam 26*a* through a slit 26*b* to a reference mirror 28. In this embodiment of measurement system the reference mirror 28 is movable in position so as to either illuminate a reference photodetector 30, via a focussing optic 31, or allow the chopped light to pass to the UUT 32, via a reflector 34 and a collimator 36. In other embodiments of the invention a beamsplitter can be used, or some other optical components, for simultaneously generating both a reference signal and a measurement signal.

The UUT 32 includes the above-mentioned scan mirror, controlled by the ESMC 25, and a photodetector or array of photodetectors for which the RSR is to be determined at a plurality of wavelengths of interest. By example only, the UUT 32 may be an imaging device that is suitable for mounting to a satellite platform. Output electrical signals from the measurement system include a chopped reference signal 30*a* and a chopped detector signal 32*a*, both of which are applied to system test electronics (STE). The STE includes the digital acquisition system 8 and the RDDL 10 of FIG. 2. A STE controller (not illustrated), such as a digital data processor, receives the measured signal output from the RDDL 10, provides the reference period setting signal 9 to the RDDL 10, and also provides other control and data processing functions, such as calculating the RSR as described below.

The reference period setting signal 9 is calculated based on the known period of the stimulus signal (i.e., from the chopper rate) and from the known period of the digital sampling rate of the chopped detector signals 32*a*, as was described above. Also as was described above, the digitized UUT output can be stored for later analysis by the RDDL 10, and is not required to be processed in real-time.

A data link (e.g., RS-232) is provided to connect the STE controller to the ESMC 25 for sending scan mirror related commands to the ESMC.

Figure 6:
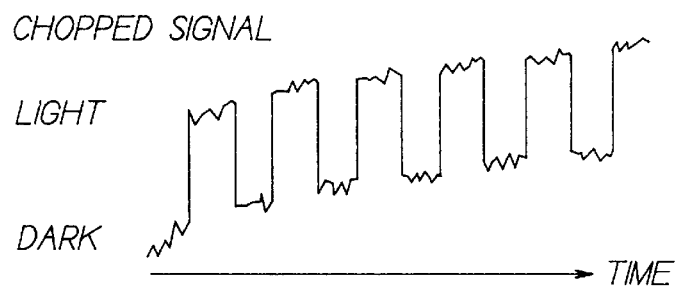
FIG. 6 illustrates a waveform representing a chopped reference signal that is generated by the RSR measurement system of FIG. 5.

The acquisition of the photodetector data 32*a* is preferably synchronized with the chopper 24 in order to extract data in the low signal-to-noise trailing regions of the RSR curve. Referring also to FIG. 6, correct synchronization implies that the system can distinguish between samples that are "light" and "dark" because they will always come in the same sequence after the start of the scan.

The period of the chopper 24 is preferably selected to be a multiple of the scan mirror period. This permits stable operation of the phase locked motor controller of the chopper 24 and allows the UUT 32 to perform a DC restore function on the "dark" side of the chopped beam. The DC restore function prevents the output signal from wandering outside of a dynamic range set by the combination of photodetector amplifier offset and gain.

In preparation for RSR data acquisition, it is first established that the monochromator slit 26b is centered for each band of wavelengths under test. The ESMC 25 is set to the nominal position for the band and a series of fine position adjustments from the monochromator 26 enables a determination of the UUT fine position setting from the detector data output 32a.

Data reduction involves two components: (a) extraction of the response from the chopped detector data 32a and reference detector data 30a, and (b) computation of the RSR for each photodetector of the UUT 32 using the extracted response data. Photodetector measurements are preferably computed from a total of N samples of chopped data using a digital lock-in or chopper correlation technique given by:

$$\text{Det response} = (2/N)(\Sigma \text{ Light samples} - \Sigma \text{ Dark samples}), \quad (1)$$

where, as in FIG. 6, "Light" means samples without obscuration and "Dark" means that the chopper 24 is inserted.

The mathematical operation shown in (1) provides the same bandpass function as an analog switching lock-in amplifier. The differencing rejects low frequency drift and the summations reduce high frequency noise.

To provide an equal number of light and dark samples it is preferred to choose the total number of samples in a set as a multiple of a frame rate of the UUT 32 divided by the chopping frequency.

The RSR is then determined for each wavelength ($\lambda$) by:

$$RSR\lambda = \frac{Det \text{ response } \lambda * 100\%}{\text{MAX}(Det \text{ response}/Ref \text{ response}) * Ref \text{ response}\lambda} \quad (2)$$

In accordance with this invention, the RDDL 10 of FIGS. 2, 3A and 3B is used with the chopped detector signals 32a and the chopped reference signals 30a to produce the Det and Ref response measurements used in equation (2) to determine the RSR for each wavelength. The MAX function is employed to find the maximum of the relative response expressed as a ratio of the UUT photodetector response and the reference detector (30) response at each wavelength of interest. This normalizes the RSR to 100% of its peak value (see FIG. 4).

Figure 7:
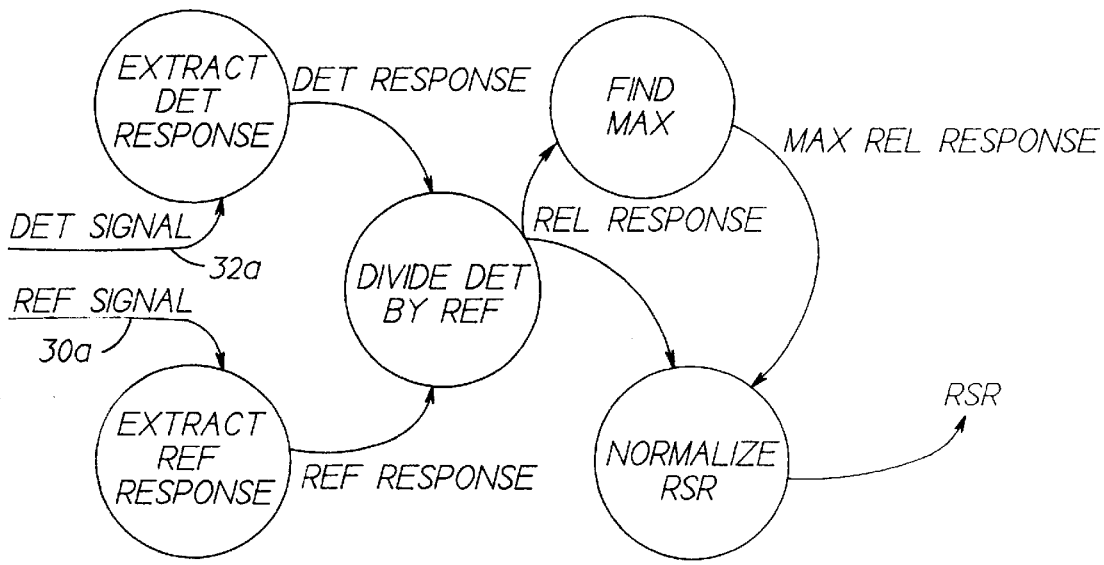
FIG. 7 is a logic flow diagram illustrating processing required to compute the RSR in the RSR measurement system of FIG. 5.

An exemplary data flow diagram for the processing required to determine the RSR is shown in FIG. 7, wherein the RDDL 10 of this invention is employed to extract the detector response and the reference response from the chopped detector signal 32a and from the chopped reference signal 30a, respectively.

In this regard the detector and reference signals 32a and 30a, respectively, are applied to the digital acquisition system 8 of FIG. 2 where they are converted to equivalent digital values to provide the data signal 8a. The test system controller programs in a reference period setting 9 to the RDDL 10, the reference period setting being equal to the sampling frequency multiplied by the modulation period, as described above. The RDDL 10 then operates to incrementally phase search through the digital data input, as described in FIG. 3B, so as to determine the maximum measured signal output (i.e., the reference photodetector 30 response and the UUT photodetector response at each wavelength of interest). The maximum measured signal outputs from the RDDL 10 are then employed, as in equation 2 and FIG. 7, to determine the RSR of the UUT photodetectors.

It can be appreciated that the RDDL 10 of this invention does not require a real-time reference frequency input as in the conventional lock-in amplifier. The RDDL 10 instead requires only a knowledge of the period of the modulation period and the sampling period of the input signal to derive the value of the reference period input signal 9. Cross-correlation is performed to determine the phase for the synchronous detection of a signal.

It should be noted that whereas conventional lock-in amplifiers accept only analog input signals, the RDDL 10 of this invention can be readily retrofitted into any digital acquisition system.

In summary, the RDDL 10 of this invention has a first input coupled to a periodic electrical signal and an output for outputting an indication of a relative measurement of a desired signal component of the input signal. The RDDL 10 also has a second input for receiving a signal that specifies a reference period setting as a function of the sampling frequency and the modulation period of the input signal. The RDDL 10 operates to autonomously generate a lock-in reference signal having the specified period and a phase that is adjusted to maximize a magnitude of the outputted desired electrical signal.

While the invention has been particularly shown and described with respect to preferred embodiments thereof, it will be understood by those skilled in the art that changes in form and details may be made therein without departing from the scope and spirit of the invention. By example, the RDDL 10 can be embodied within hardware elements or as a suitable programmed data processor, such as a digital signal processor (DSP). Combinations of hardware elements and programmed elements can also be employed. Also, the mechanical chopper 24 illustrated in FIG. 5 can be replaced by a cross-correlation function of a chopper mask with the detector data, such as by convolving a chopper mask (a periodic sequence of +1's followed by -1's) with data output from the UUT photodetector(s).

As such, it should be clear that the teaching of this invention is not to be limited to only the explicitly described embodiments set forth above, but should be given a scope commensurate with the claims that follow.

What is claimed is:

1. A method for characterizing a unit under test, comprising the steps of:
    stimulating a unit under test to output a periodic electrical signal; and
    processing the periodic electrical signal to obtain an indication of a magnitude of a desired periodic signal component of the electrical signal, the step of processing including the steps of:
    sampling the periodic electrical signal to generate, for each sample, a corresponding digital equivalent value of the periodic electrical signal;
    specifying a reference period setting value as a function of a sampling frequency and a period of the periodic electrical signal;
    generating a digital equivalent of a periodic reference signal having a specified period and phase;
    multiplying the digital equivalent of the periodic electrical signal times the digital equivalent of the periodic reference signal to generate a product signal;
    low pass filtering the product signal; and
    adjusting the phase of the digital equivalent of the periodic reference signal in accordance with the low pass filtered product signal and the specified reference period setting value so as to maximize a magnitude of the desired periodic signal component of the periodic electrical signal.

2. A method as set forth in claim 1, wherein the step of stimulating includes a step of operating an optical source to provide light having wavelengths within a predetermined range of wavelengths.

3. A method as set forth in claim 1, wherein the step of processing includes a preliminary step of buffering a plurality of the digital equivalent values.

4. A method as set forth in claim 1, wherein the step of stimulating includes a step of chopping an output of an optical source.

5. A method as set forth in claim 4, wherein the step of specifying specifies a period that is a function of a chopping period.

6. A method as set forth in claim 1, wherein the step of stimulating includes a step of operating an optical source, and wherein the periodic electrical signal is generated by at least one photodetector that is illuminated by the optical source.

7. A method as set forth in claim 6, wherein the method characterizes, for at least one wavelength of light that is generated by the optical source, a spectral response of the at least one photodetector.

* * * * *